(12) United States Patent
Yoo et al.

(10) Patent No.: US 7,781,282 B2
(45) Date of Patent: Aug. 24, 2010

(54) SHARED CONTACT STRUCTURE, SEMICONDUCTOR DEVICE AND METHOD OF FABRICATING THE SEMICONDUCTOR DEVICE

(75) Inventors: Abraham Yoo, Hwasung-si (KR); Hee-Sung Kang, Seongnam-si (KR); Heon-Jong Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 361 days.

(21) Appl. No.: 11/377,455

(22) Filed: Mar. 17, 2006

(65) Prior Publication Data

US 2007/0018254 A1 Jan. 25, 2007

(30) Foreign Application Priority Data

Jul. 25, 2005 (KR) ...................... 10-2005-0067427

(51) Int. Cl.
*H01L 21/8238* (2006.01)
(52) U.S. Cl. ................... 438/230; 438/266; 438/231; 438/233; 257/E27.098; 257/E21.632; 257/204; 257/197
(58) Field of Classification Search ................. 438/230, 438/231, 233
See application file for complete search history.

(56) References Cited

U.S. PATENT DOCUMENTS

| | | |
|---|---|---|
| 6,100,569 A | 8/2000 | Yeh |
| 6,306,701 B1 | 10/2001 | Yeh |
| 6,413,811 B1 | 7/2002 | Masuoka |
| 6,838,732 B2 * | 1/2005 | Igarashi et al. .............. 257/344 |
| 6,881,614 B2 | 4/2005 | Liaw |

FOREIGN PATENT DOCUMENTS

| | | |
|---|---|---|
| JP | 09-293865 | 11/1997 |
| JP | 11-186389 | 7/1999 |
| JP | 2004-273642 | 9/2004 |
| KR | 10-1999-010370 | 2/1999 |
| KR | 1020040016496 A | 2/2004 |
| TW | 305061 | 5/1997 |
| TW | 307046 | 6/1997 |
| TW | 347578 | 12/1998 |

OTHER PUBLICATIONS

Search Report for corresponding Taiwan Patent Application No. 95110011 dated Mar. 4, 2008.
Korean Office Action dated Nov. 9, 2006.

* cited by examiner

*Primary Examiner*—Marcos D. Pizarro
*Assistant Examiner*—Eva Y. Montalvo
(74) *Attorney, Agent, or Firm*—Harness, Dickey & Pierce, P.L.C.

(57) ABSTRACT

A shared contact structure, semiconductor device and method of fabricating the semiconductor device, in which the shared contact structure may include a gate electrode disposed on an active region of a substrate and including facing first and second sidewalls. The first sidewall may be covered with an insulating spacer. The source/drain regions may be formed within the active region adjacent the first sidewall, and provided on the opposite side of the second sidewall. A corner protection pattern may be formed adjacent the source/drain regions and the insulating spacer, and covered by an inter-layer dielectric. A shared contact plug may be formed through the inter-layer dielectric, to be in contact with the gate electrode, corner protection pattern and source/drain regions.

8 Claims, 8 Drawing Sheets

SHARED CONTACT STRUCTURE, SEMICONDUCTOR DEVICE AND METHOD OF FABRICATING THE SEMICONDUCTOR DEVICE

PRIORITY STATEMENT

This application claims the benefit of Korean Patent Application No. 2005-0067427, filed Jul. 25, 2005, the contents of which are hereby incorporated herein by reference in their entirety.

BACKGROUND OF THE INVENTION

1. Field of the Invention

Example embodiments of the present invention relate, in general, to a shared contact structure, a semiconductor device and a method of fabricating the semiconductor device.

2. Description of the Related Art

As electronic products are becoming thinner, more lightweight and compact, various research has been conducted in an effort to enhance the performance of semiconductor devices. A semiconductor device, for example, a Static Random Access Memory (SRAM) has generally low power consumption and fast operating speed, as compared to a Dynamic RAM (DRAM). SRAM is widely used as an embedded memory in a central processing unit (CPU), for example.

A unit cell of the SRAM is classified into two primary types: a high load resistor SRAM cell, which employs a high load resistor as a load device, and a complementary metal oxide semiconductor (CMOS) SRAM cell, which employs a P-channel MOS (PMOS) transistor as a load device. The CMOS SRAM cell generally has a plurality of transistors and a pair of nodes. A technique using a shared contact structure is employed to effectively arrange the nodes.

FIGS. 1 to 3 are cross-sectional views illustrating a method of fabricating a conventional shared contact structure. Referring to FIG. 1, the conventional shared contact structure has an isolation layer 13 defining an active region 12 within a semiconductor substrate 11. A gate electrode 19 is formed to cross over the active region 12. The gate electrode 19 has a gate pattern 17 and a gate silicide layer 18 which are sequentially stacked. The gate electrode 19 crosses over the active region 12 and covers a given region of the isolation layer 13. A gate dielectric 15 is interposed between the gate electrode 19 and the active region 12. Spacers 25 are formed on sidewalls of the gate electrode 19. The spacer 25 is composed of an oxide pattern 23 and a nitride pattern 24 which are sequentially stacked. A source/drain extension 21 is formed in the active region 12 below the spacer 25. A source/drain region 29 is formed in the active region 12 adjacent to the gate electrode 19. The source/drain extension 21 is in contact with the source/drain region 29. The source/drain region 29 is composed of a highly doped drain region 27 and a source/drain silicide layer 28 which are sequentially stacked. The semiconductor substrate 11 with gate electrode 19 and the source/drain region 29 is covered by an etch stop layer 31 and an inter-layer dielectric (ILD) 33 which are sequentially stacked. A nitride layer having an etch selectivity with respect to the ILD 33 is used as the etch stop layer 31.

Subsequently, a contact hole 35 is formed through the ILD 33 to form a shared contact structure. The etch stop layer 31 is exposed on a bottom surface of the contact hole 35.

Referring to FIG. 2, the exposed etch stop layer 31 is removed to form an extended contact hole 35'. An upper region of the gate electrode 19 is partially exposed within the extended contact hole 35', and a top surface of the source/drain region 29 is also partially exposed. In this case, when the etch stop layer 31 remains on the exposed surfaces of the gate electrode 19 and the source/drain region 29, there occurs an increase in contact resistance. Accordingly, the process of removing the etch stop layer 31 must have a sufficient process margin. That is, the process of forming the extended contact hole 35' includes a process of over-etching the etch stop layer 31. Accordingly, the spacer 25 is etched while the etch stop layer 31 is being removed, so that a top surface of the source/drain extension 21 is partially exposed. In addition, an oxide layer (e.g., a natural oxide layer) remains on the exposed surfaces of the gate electrode 19 and the source/drain region 29. This oxide layer causes an increase in contact resistance. The oxide layer is removed by a wet cleaning process or dry etching process. While the oxide layer is being removed, the surface of the source/drain extension 21 is partially etched by the wet cleaning or dry etching process. That is, an extended hole 35E is formed in a contact region between the source/drain extension 21 and the source/drain region 29, as shown in FIG. 2.

Referring to FIG. 3, a shared contact plug 39 is formed to fill the extended contact hole 35'. The shared contact plug 39 is formed by sequentially stacking a barrier metal layer 37 and a conductive layer 38. As a result, the shared contact plug 39 is in contact with the source/drain region 29 and the gate electrode 19.

However, while the shared contact plug 39 is being formed, the extended hole 35E (see FIG. 2) is also filled with the barrier metal layer 38 to form a plug extension 37E. The plug extension 37E forms a leakage current path between the shared contact plug 39 and the active region 12.

SUMMARY OF THE INVENTION

An example embodiment of the present invention is directed to a shared contact structure. The shared contact structure may include a gate electrode disposed on an active region of a substrate and having first and second sidewalls facing each other. An insulating spacer covers the first sidewall. A source/drain region may be formed within the active region, adjacent to the first sidewall and on the opposite side of the second sidewall. A corner protection pattern may be formed adjacent to the source/drain region and the insulating spacer on the substrate, and is covered by an inter-layer dielectric. A shared contact plug penetrates the inter-layer dielectric, and is in contact with the gate electrode, corner protection pattern and source/drain region.

Another example embodiment of the present invention is directed to a semiconductor device. The semiconductor device includes an isolation layer disposed on a substrate to define an active region, and a gate electrode crossing over the active region and having first and second sidewalls facing each other. An insulating spacer covers the first sidewall. A lightly doped drain region may be disposed within the active region below the insulating spacer, and a highly doped drain region may be disposed within the active region adjacent to the first sidewall, and on the opposite side of the second sidewall, so as to contact the lightly doped drain region. A source/drain metal silicide layer is formed on the highly doped drain region, and a corner protection pattern is formed adjacent the source/drain metal silicide layer and insulating spacer.

Another example embodiment of the present invention is directed to a method of fabricating a semiconductor device. In the method, a gate pattern having first and second sidewalls on either side of the gate pattern facing each other is formed on a substrate. A lightly doped drain region is formed adjacent the first sidewall and on the opposite side of the second sidewall within the substrate, and an insulating spacer is formed to cover the first sidewall. A highly doped drain region is formed adjacent the first sidewall and on the opposite side of the second sidewall within the substrate. A corner protection pattern is formed adjacent to the highly doped drain region and insulating spacer and contacts a sidewall of the insulating spacer.

Another example embodiment of the present invention is directed to a method of fabricating a semiconductor device. In the method, a gate pattern having first and second sidewalls on either side thereof is formed on a substrate, and the first sidewall is covered with an insulating spacer. A source/drain region is formed below the insulating spacer and adjacent to the first sidewall, but opposite the side of the gate pattern having the second sidewall. A corner protection pattern is formed adjacent to source/drain region and insulating spacer.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of example embodiments the present invention.

DETAILED DESCRIPTION OF EXAMPLE EMBODIMENTS

Figure 1:
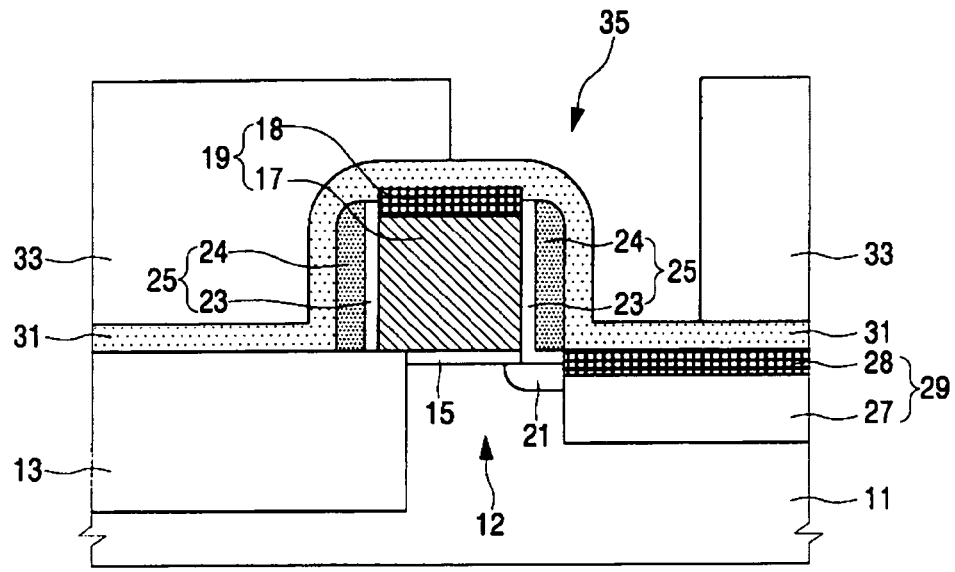
FIGS. 1 to 3 are cross-sectional views illustrating a method of fabricating a conventional shared contact structure.
Figure 2:
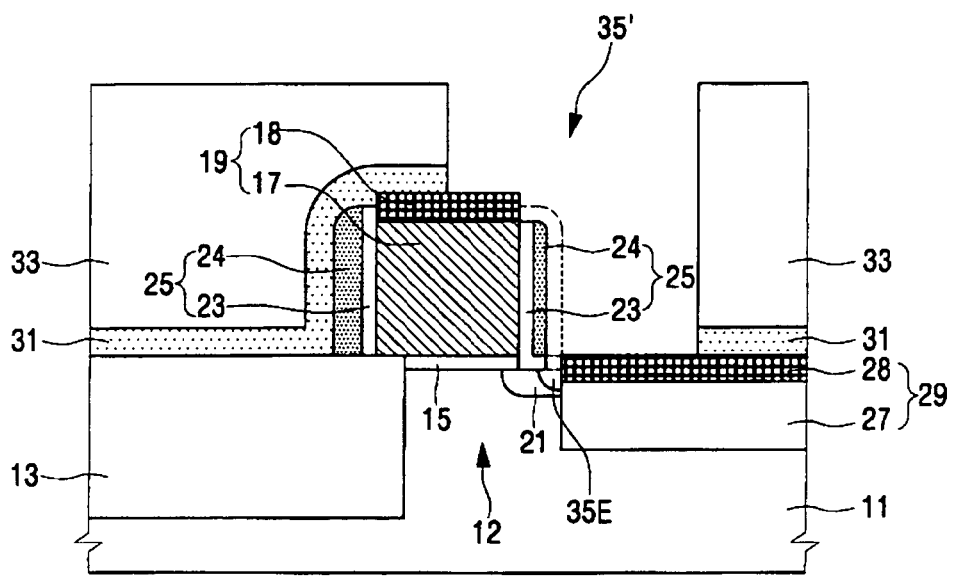
Figure 3:
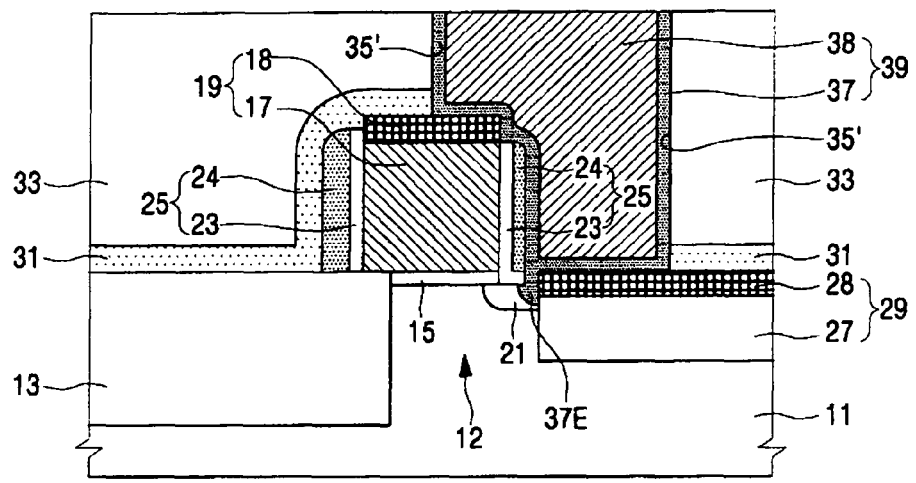

The present invention will now be described more fully hereinafter with reference to the accompanying drawings, in which example embodiments of the invention are shown. This invention may, however, be embodied in different forms and should not be construed as limited to example embodiments set forth herein. Rather, these example embodiments are provided so that this disclosure will be thorough and complete, and will fully convey the scope of the invention to those skilled in the art. In the drawings, the thickness of layers and regions are exaggerated for clarity. In addition, when a layer is described to be formed "on" other layer or "on" a substrate, which means that the layer may be formed on the other layer or on the substrate, or a third layer may be interposed between the layer and the other layer or the substrate. Like numerals refer to like elements throughout the specification.

Figure 4:
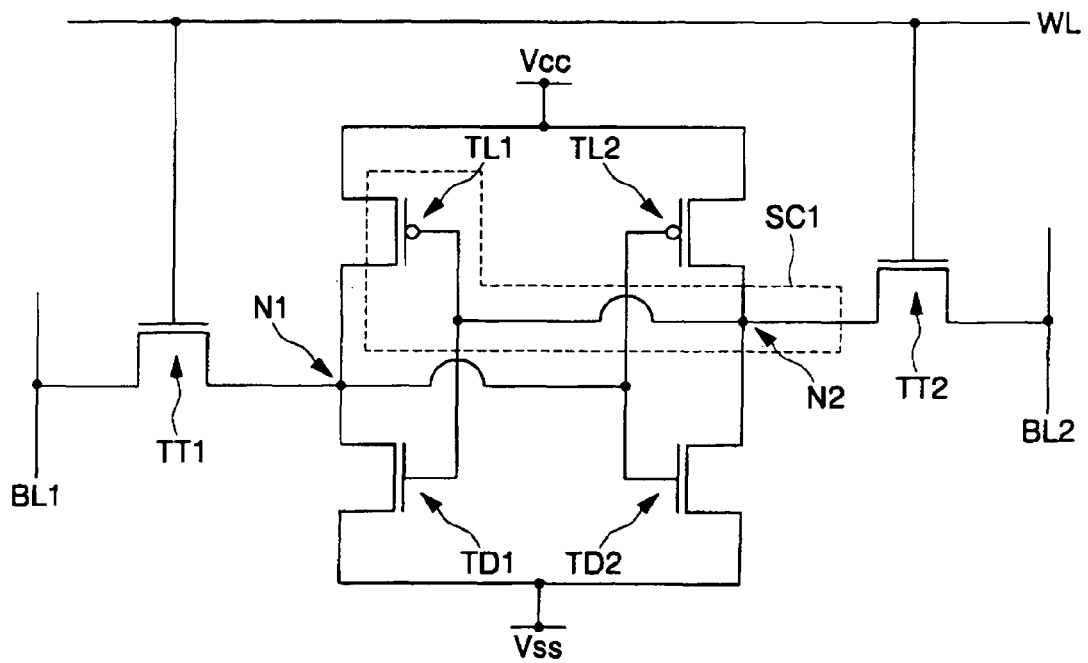
FIG. 4 is an equivalent circuit diagram of a CMOS SRAM cell applicable to example embodiments of the present invention.

FIG. 4 is an equivalent circuit diagram of a CMOS SRAM cell applicable to example embodiments of the present invention.

Referring to FIG. 4, the CMOS SRAM cell includes a pair of driver transistors TD1 and TD2, a pair of transfer transistors TT1 and TT2, and a pair of load transistors TL1 and TL2. The driver transistors TD1 and TD2 may be referred to as pull down transistors, the transfer transistors TT1 and TT2 may be referred to as pass transistors, and the load transistors TL1 and TL2 may be referred to as pull up transistors. The driver transistors TD1 and TD2 and the transfer transistors TT1 and TT2 may be embodied as NMOS transistors. The load transistors TL1 and TL2 may be PMOS transistors, for example.

The first driver transistor TD1 and the first transfer transistor TT1 are connected in series to each other. A source region of the first driver transistor TD1 is electrically connected to a ground line Vss, and a drain region of the first transfer transistor TT1 is electrically connected to a first bit line BL1. Similarly, the second driver transistor TD2 and the second transfer transistor TT2 are connected in series to each other. A source region of the second driver transistor TD2 is electrically connected to the ground line Vss, and a drain region of the second transfer transistor TT2 is electrically connected to a second bit line BL2.

A source region of the first load transistor TL1 is electrically connected to a power supply line Vcc, and a drain region of the first load transistor TL1 is electrically connected to a drain region of the first driver transistor TD1. Similarly, a source region of the second load transistor TL2 is electrically connected to the power supply line Vcc, and a drain region of the second load transistor TL2 is electrically connected to a drain region of the second driver transistor TD2.

The drain region of the first load transistor TL1, the drain region of the first driver transistor TD1, and the source region of the first transfer transistor TT1 correspond to a first node N1. In addition, the drain region of the second load transistor TL2, the drain region of the second driver transistor TD2, and the source region of the second transfer transistor TT2 correspond to a second node N2. A gate electrode of the first driver transistor TD1 and a gate electrode of the first load transistor TL1 are electrically connected to the second node N2, and a gate electrode of the second driver transistor TD2 and a gate electrode of the second load transistor TL2 are electrically connected to the first node N1. In addition, gate electrodes of the first and second transfer transistors TT1 and TT2 are electrically connected to a word line WL.

In order to implement the above-described CMOS SRAM cell, an ohmic contact must be formed in the first and second nodes N1 and N2. A method of using what may be referred to as a "shared contact structure" may be used to create this ohmic contact in the first and second nodes N1 and N2. That is, a first shared contact structure SC1 (see dotted line enclosure in FIG. 4) may be used to electrically connect the gate electrode of the first load transistor TL1 to the drain region of the second load transistor TL2. In addition, a second shared contact structure SC2 may be used to electrically connect the gate electrode of the second load transistor TL2 to the drain region of the first load transistor TL1.

Figure 10:
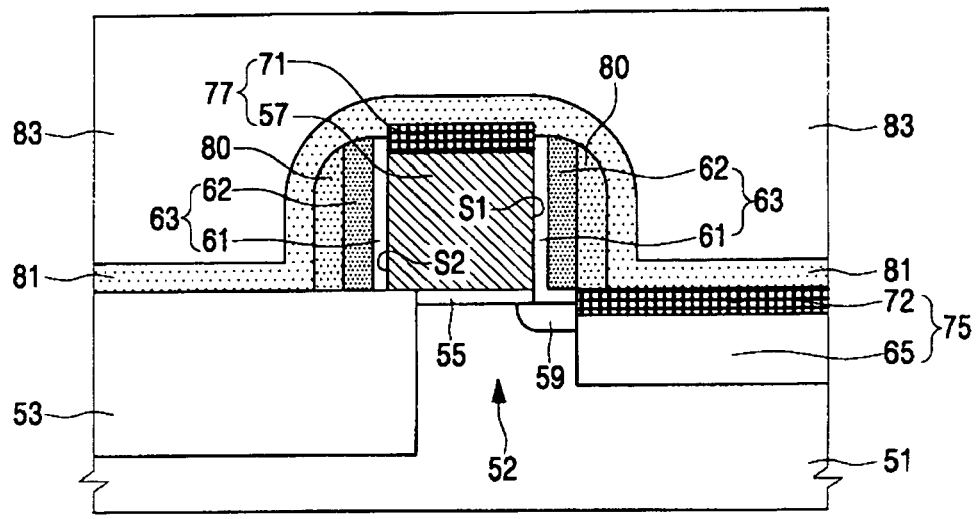
Figure 11:
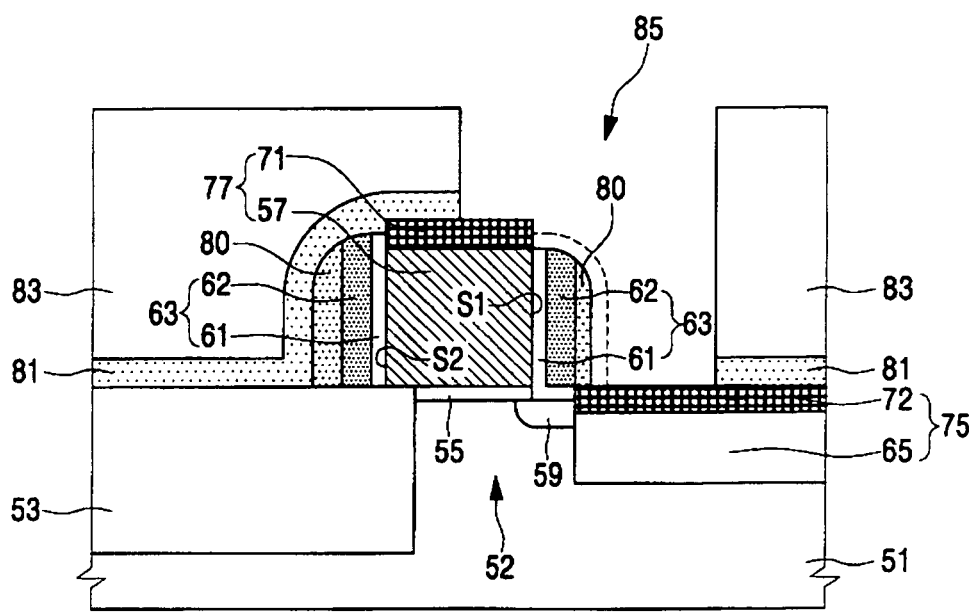
Figure 12:
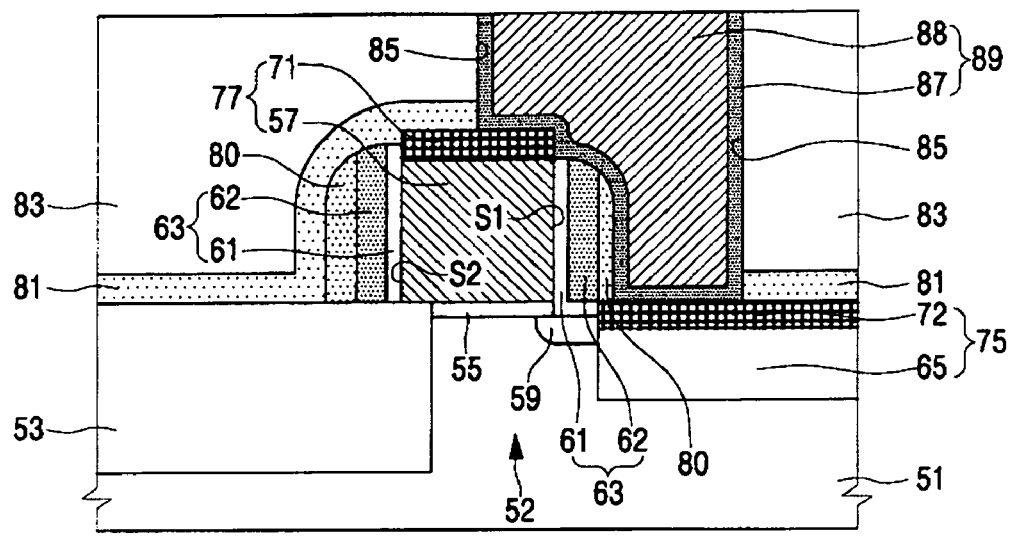

FIGS. 5 to 12 are cross-sectional views illustrating a method of fabricating a shared contact structure in accordance with an example embodiment of the present invention. Referring initially to FIG. 12, the shared contact structure according to an example embodiment of the present invention includes an active region 52 formed within a substrate 51. The substrate 51 may be a semiconductor substrate, for example, a silicon wafer or other silicon based structure, for example. An isolation layer 53 defining the active region 52 may be formed within substrate 51. The isolation layer 53 may have an insulating layer, for example, a silicon oxide layer although example embodiments are not limited to silicon oxide as the insulating layer; other oxides or nitrides may be used as an insulating layer 53.

A gate electrode 77 is formed on the active region 52. The gate electrode 77 has first and second sidewalls S1 and S2 facing each other. The gate electrode 77 may have a gate pattern 57 and a gate metal silicide layer 71 which are sequentially stacked. The gate electrode 77 may cross over the active region 52 and cover a given region of the isolation layer 53. A gate dielectric 55 is interposed between the gate electrode 77 and the active region 52. The gate dielectric 55 may act to insulate the gate electrode 77 from the active region 52. The gate pattern 57 may be a polysilicon layer, for example. The gate metal silicide layer 71 may be a cobalt silicide layer (CoSi) or a nickel silicide layer (NiSi), for example. The gate dielectric 55 may be a silicon oxide layer or a high-k dielectric, for example.

Insulating spacers 63 may be formed on the first and second sidewalls S1 and S2 of the gate electrode 77. That is, the insulating spacer 63 may be formed on the first sidewall S1 of the gate electrode 77. In addition, the insulating spacer 63 may be formed on the second sidewall S2 of the gate electrode 77. The insulating spacer 63 may have an inner spacer 61 covering the first sidewall S1 and an outer spacer 62 covering an outer wall of the inner spacer 61. The inner spacer 61 may be an oxide layer, for example, a silicon oxide layer, and the outer spacer 62 may be a nitride layer, for example, a silicon nitride layer or a silicon oxynitride layer, for example.

A source/drain extension 59 may be disposed in the active region 52 below the insulating spacer 63. As shown in FIG. 12, the source/drain extension 59 may be disposed adjacent to the first sidewall S1 of the gate electrode 77 and below the insulating spacer 63. In addition, the isolation layer 53 may be disposed adjacent to the second sidewall S2 of the gate electrode 77 and below the insulating spacer 63. The source/drain extension 59 may be a lightly doped drain region having either N- or P-type conductivity, for example.

A source/drain region 75 is disposed in the active region 52 adjacent to the gate electrode 77. That is, the source/drain region 75 is disposed within the active region 52 adjacent to the first sidewall S1 and on the opposite side of the second sidewall S2. The source/drain extension 59 is in contact with the source/drain region 75. The source/drain region 75 may have a highly doped drain region 65 and a source/drain metal silicide layer 72 which are sequentially stacked. A top surface of the source/drain region 75 may be higher than a top surface of the active region 52. In addition, the top surface of the source/drain region 75 may be higher than a top surface of the source/drain extension 59. The highly doped drain region 65 may be an impurity region having either N- or P-type conductivity. In this case, the highly doped drain region 65 and the source/drain extension 59 may have the same conductivity type. For example, when the highly doped drain region 65 is a P-type conductivity region, the source/drain extension 59 may be a lightly doped drain region having P-type conductivity. The source/drain metal silicide layer 72 may be a CoSi layer or a NiSi layer, for example.

A corner protection pattern 80 may be is disposed adjacent to the source/drain region 75 and the insulating spacer 63. The corner protection pattern 80 is disposed on an edge of the source/drain region 75 contacting the insulating spacer 63. That is, the corner protection pattern 80 partially covers the source/drain region 75 and is in contact with a sidewall of the insulating spacer 63. The corner protection pattern 80 may also be disposed on the sidewall adjacent the insulating spacer 63 of the second sidewall S2, as shown in FIG. 12. The corner protection pattern 80 may be a nitride layer, for example, a silicon nitride layer or a silicon oxynitride layer.

An etch stop layer 81 and an inter-layer dielectric ILD 83 may be sequentially stacked on the substrate 51 with the gate electrode 77, the source/drain region 75 and the corner protection pattern 80. The etch stop layer 81 may be an insulating layer having an etch selectivity with respect to the ILD 83. For example, the ILD 83 may be an insulating layer, for example, a silicon oxide layer. In this case, the etch stop layer 81 may be a nitride layer, a silicon nitride layer or a silicon oxynitride layer, for example.

A shared contact plug 89 is formed through the ILD 83 and the etch stop layer 81 to be in contact with the gate electrode 77, the source/drain region 75 and the corner protection pattern 80. The shared contact plug 89 may have a conductive layer 88 and a barrier metal layer 87 covering sidewalls and a bottom surface of the conductive layer 88. The barrier metal layer 87 may be a titanium layer (Ti), a titanium nitride layer (TiN), a tantalum layer (Ta), a tantalum nitride layer (TaN), or a combination of several of these components. The conductive layer 88 may be a tungsten layer W. Alternatively, the shared contact plug 89 may be composed only of the conductive layer 88. The shared contact plug 89 is electrically connected to the gate electrode 77 and the source/drain region 75.

As discussed in the related art, a leakage current path could occur when the shared contact plug 89 is in contact with the source/drain extension 59. However, according to this example embodiment of the present invention, the corner protection pattern 80 is formed on the source/drain region 75. The corner protection pattern 80 is disposed on an edge of the source/drain region 75 in contact with the insulating spacer 63. Accordingly, any contact between the shared contact plug 89 and the source/drain extension 59 is prevented by the corner protection pattern 80 and insulating spacer 63.

Figure 17:
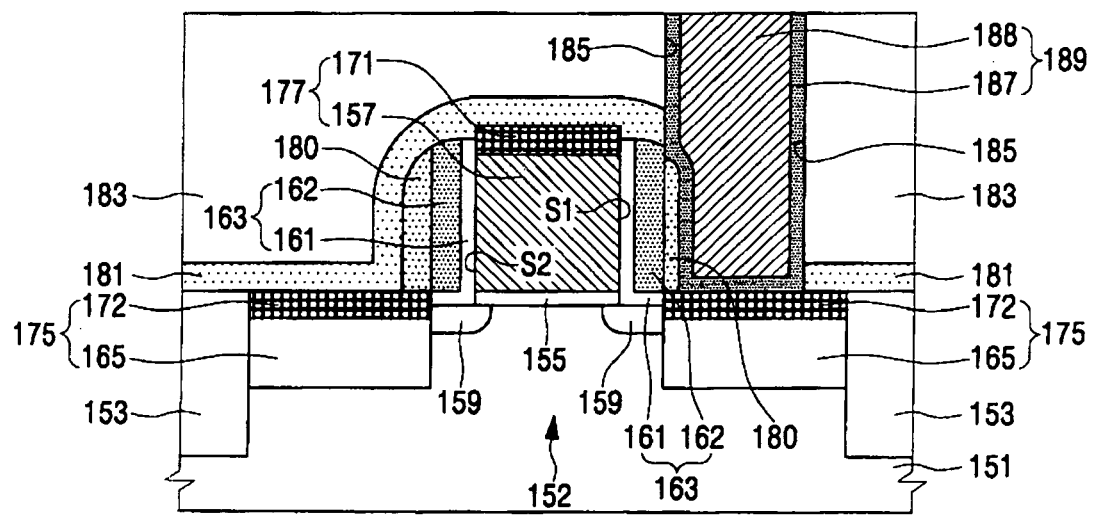

A semiconductor device having a corner protection pattern according to another example embodiment of the present invention is described with reference to FIG. 17. Referring to FIG. 17, the semiconductor device includes an isolation layer 153 which is formed on a substrate 151 to define an active region 152. A gate electrode 177 is formed to cross over the active region 152. The gate electrode 177 has first and second sidewalls S1 and S2 facing each other. The gate electrode 177 may have a gate pattern 157 and a gate metal silicide layer 171 which are sequentially stacked. A gate dielectric 155 is interposed between the gate electrode 177 and the active region 152. The gate pattern 157 may be a polysilicon layer. The gate metal silicide layer 171 may be a CoSi layer or a NiSi layer, for example. The gate dielectric 155 may be a silicon oxide layer or a high-k dielectric, for example.

Insulating spacers 163 may be formed on the first and second sidewalls S1 and S2 of the gate electrode 177. That is, the insulating spacer 163 may be formed on the first sidewall S1 of the gate electrode 177. The insulating spacer 163 may also be formed on the second sidewall S2 of the gate electrode 177. The insulating spacer 163 may include an inner spacer 161 covering the first sidewall S1 and an outer spacer 162 covering an outer wall of the inner spacer 161. The inner spacer 161 may be composed of an oxide layer, for example, a silicon oxide layer, and the outer spacer 162 may be composed of a nitride layer, for example, a silicon nitride layer or a silicon oxynitride layer, for example.

A lightly doped drain (LDD) region 159 is disposed in the active region 152 below the insulating spacer 163. As shown in FIG. 17, a LDD region 159 may be disposed in the active region 152 adjacent to each side of the gate electrode 177. The LDD region 159 may be an impurity region having either N- or P-type conductivity, for example.

A source/drain region 175 is formed in the active region 152 adjacent to the gate electrode 177. The source/drain region 175 may be disposed in each active region 152 adjacent to both sides of the gate electrode 177, as shown in FIG. 17. The LDD region 159 is in contact with the source/drain region 175. The source/drain region 175 may have a highly doped drain region 165 and a source/drain metal silicide layer 172 which are sequentially stacked. A top surface of the source/drain region 175 may be higher than a top surface of the active region 152. In addition, the top surface of the source/drain region 175 may be higher than a top surface of the LDD region 159. The highly doped drain region 165 may be an impurity region having either N- or P-type conductivity. In this case, the highly doped drain region 165 and the LDD region 159 may have the same conductivity type. For example, when the highly doped drain region 165 is an impurity region having a P-type conductivity, the LDD region 159 may be an LDD region having P-type conductivity. The source/drain meal silicide layer 172 may be a CoSi layer or a NiSi layer, for example.

A corner protection pattern 180 is disposed on the source/drain region 175. The corner protection pattern 180 is disposed on an edge of the source/drain region 175 in contact with the insulating spacer 163. That is, the corner protection pattern 180 partially covers the source/drain region 175 and is in contact with a sidewall of the insulating spacer 163. The corner protection pattern 180 may be formed on each source/drain region 175 at both sides of the gate electrode 177, as shown in FIG. 17. The corner protection pattern 180 may be an insulating layer, for example, a silicon nitride layer or a silicon oxynitride layer.

An etch stop layer 181 and an ILD 183 may be sequentially stacked on the substrate 151 with the gate electrode 177, the source/drain regions 175 and the corner protection patterns 180. The etch stop layer 181 may be an insulating layer having an etch selectivity with respect to the ILD 183. For example, the ILD 183 may be an insulating layer, for example, a silicon oxide layer. In this case, the etch stop layer 181 may be a nitride layer, for example, a silicon nitride layer or a silicon oxynitride layer, for example.

A contact plug 189 is formed through the ILD 183 and the etch stop layer 181 so as to be in contact with the source/drain region 175 and the corner protection pattern 180. The contact plug 189 may have a conductive layer 188, and a barrier metal layer 187 covering sidewalls and a bottom surface of the conductive layer 188. The barrier metal layer 187 may be a titanium layer Ti, a titanium nitride layer TiN, a tantalum layer Ta, a tantalum nitride layer TaN, or a combination layer of several of these components. The conductive layer 188 may be a tungsten layer W. Alternatively, the contact plug 189 may be composed of only the conductive layer 188. The contact plug 189 is electrically connected to the source/drain region 175.

A leakage current path could occur when the contact plug 189 is in contact with the LDD region 159. However, according to this example embodiment, the corner protection pattern 180 is disposed on the source/drain region 175. The corner protection pattern 180 is disposed on an edge of the source/drain region 175 in contact with the insulating spacer 163. Accordingly, any contact between the contact plug 189 and the LDD region 159 is prevented by the corner protection pattern 180 and the insulating spacer 163.

Figure 5:
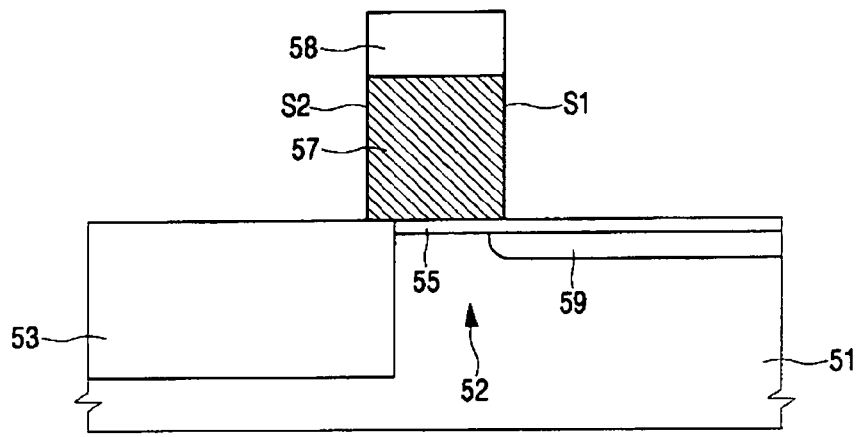
FIGS. 5 to 12 are cross-sectional views illustrating a method of fabricating a shared contact structure in accordance with an example embodiment of the present invention.

Referring now to FIG. 5, in an example method of fabricating a shared contact structure according to an example embodiment of the present invention, an isolation layer 53 may be formed which defines an active region 52 within a substrate 51. The substrate 51 may be formed of a semiconductor substrate, for example, a silicon wafer or other silicon-based structure. The isolation layer 53 may be formed of an insulating layer, for example, a silicon oxide layer.

A gate dielectric 55 may be formed on the active region 52. The gate dielectric 55 may be formed of a silicon oxide layer or a high-k dielectric. As an example, the gate dielectric 55 may be formed of a silicon oxide layer by a thermal oxidation method.

A gate pattern 57 is formed on the substrate 51 with gate dielectric 55. The process of forming the gate pattern 57 may include forming a polysilicon layer on the substrate 51 with gate dielectric 55 and then patterning the polysilicon layer. The process of patterning the polysilicon layer may include forming a hard mask pattern 58 on the polysilicon layer and anisotropically etching the polysilicon layer using the hard mask pattern 58 as an etch mask. The hard mask pattern 58 may be composed of a nitride layer, for example, a silicon nitride layer. The gate pattern 57 may cross over the active region 52 and cover a given region of the isolation layer 53. The gate pattern 57 may have first and second sidewalls S1 and S2 facing each other.

Impurity ions may be implanted into the active region 52 using the hard mask pattern 58 and the gate pattern 57 as ion implantation masks, so as to form a source/drain extension 59. The source/drain extension 59 may be formed of an LDD region having either N- or P-type conductivity. Subsequently, the hard mask pattern 58 may be removed to expose the gate pattern 57. Alternatively, after the hard mask pattern 58 is removed, impurity ions may be implanted into the active region 52 to form the source/drain extension 59. The source/drain extension 59 may be disposed adjacent to the first sidewall S1 and opposite the side of the second sidewall S2, as shown in FIG. 5.

Figure 6:
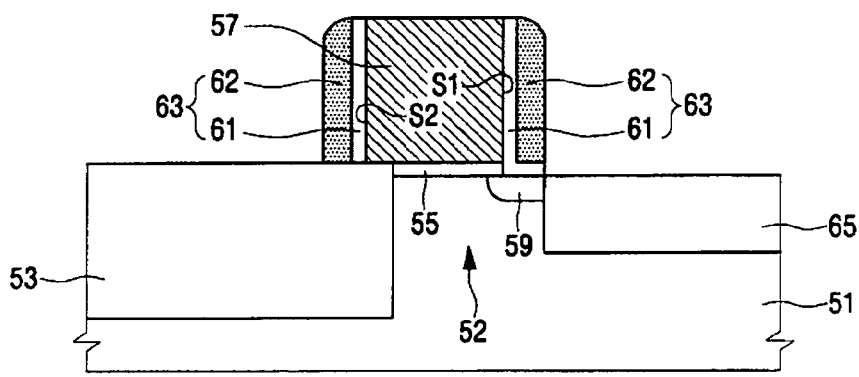

Referring to FIG. 6, insulating spacers 63 may be formed on the first and second sidewalls S1 and S2 of the gate pattern 57. The insulating spacer 63 may have an inner spacer 61 covering the first sidewall S1 and an outer spacer 62 covering an outer wall of the inner spacer 61, as shown in FIG. 6. The inner spacer 61 may be an oxide layer, for example, a silicon oxide layer, and the outer spacer 62 may be a nitride layer, for example, a silicon nitride layer or a silicon oxynitride layer.

Impurity ions may be implanted into the active region 52 using the gate pattern 57 and the insulating spacer 63 as ion implantation masks, so as to form a highly doped drain region 65. The highly doped drain region 65 may be formed by implanting impurity ions having either N- or P-type conductivity. In this case, the highly doped drain region 65 may have the same conductivity type as the source/drain extension 59. For example, when the source/drain extension 59 has a P-type conductivity, the highly doped drain region 65 may also be formed by implanting impurity ions having a P-type conductivity. The highly doped drain region 65 may be disposed adjacent to the first sidewall S1 and opposite the side of the second sidewall S2, as shown in FIG. 6.

Consequently, the source/drain extension 59 is arranged below the insulating spacer 63, and in contact with the highly doped drain region 65. Further, the highly doped drain region 65 may be formed by various methods other than as above-described method in the present example embodiment, such as via a method of forming a source/drain region which protrudes from a surface of the semiconductor substrate 51, e.g., a method of forming an elevated source/drain region.

Figure 7:
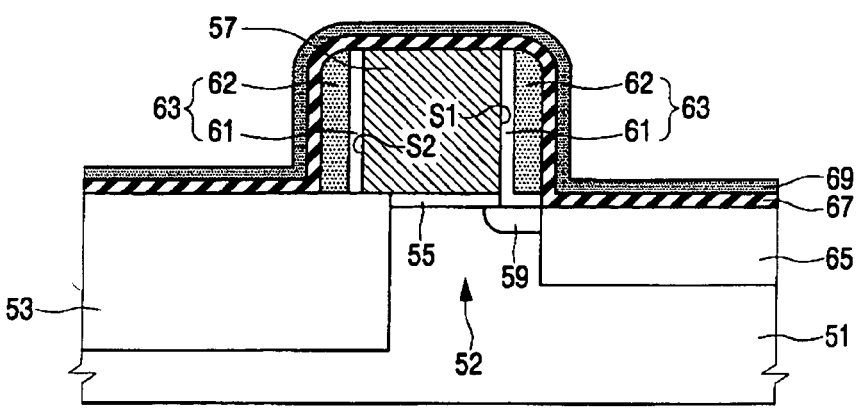

Referring to FIG. 7, a metal layer 67 and a capping layer 69 are sequentially stacked on the substrate 51 with gate pattern 57 and highly doped drain region 65. The metal layer 67 may be formed of Ni, Co or an alloy layer containing one of Ni or Co thereof. The capping layer 69 may be formed of a TiN layer. In this case, the TiN layer may act to prevent oxidation of the metal layer 67. Alternatively, the formation of the capping layer 69 may be skipped.

Figure 8:
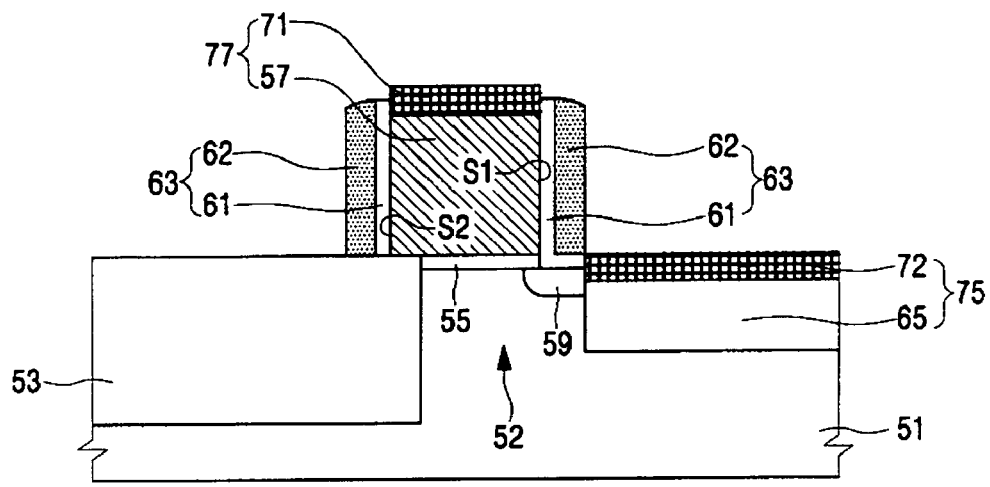

Referring to FIG. 8, a silicidation process may be applied to the substrate 51 with metal layer 67. For example, the silicidation process may include annealing the substrate 51 with metal layer 67 at a temperature of 200° C. to 700° C. During annealing, the metal layer 67 reacts with silicon atoms in the gate patter 57 and the highly doped drain region 65. Consequently, a gate metal silicide layer 71 is formed on a surface of the gate pattern 57, and a source/drain metal silicide layer 72 is formed on a surface of the highly doped drain region 65. The capping layer 69 and the metal layer 67 (which do not react with the silicon atoms) are then removed.

The subsequently stacked gate pattern 57 and gate metal silicide layer 71 constitute a gate electrode 77. In addition, the sequentially stacked highly doped drain region 65 and source/drain metal silicide layer 72, constitute a source/drain region 75. In this case, a top surface of the source/drain metal silicide layer 72 may be higher than top surfaces of the substrate 51 and source/drain extension 59. As described above, the gate metal silicide layer 71 and the source/drain metal silicide layer 72 may be formed of a CoSi layer or a NiSi layer. Alternatively, the process of forming the gate metal silicide layer 71 and the source/drain metal silicide layer 72 may be omitted. That is, the gate electrode 77 may be composed of only the gate pattern 57, and the source/drain region 75 may be composed of only the highly doped drain region 65.

Figure 9:
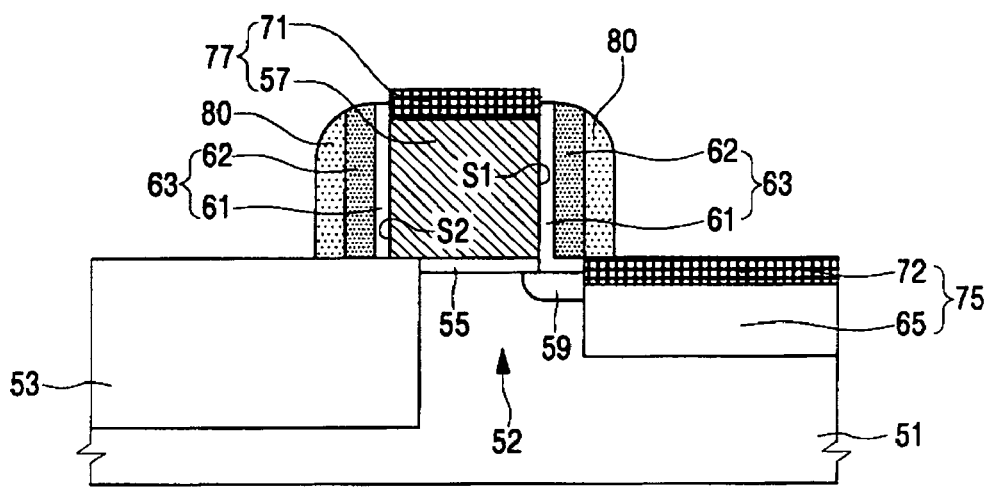

Referring to FIG. 9, a corner protection pattern 80 is formed adjacent to the source/drain region 75 and the insulating spacer 63. The corner protection pattern 80 may be formed on an edge of the source/drain region 75 adjacent to the insulating spacer 63. In this case, the corner protection pattern 80 may be in contact with a sidewall of the insulating spacer 63. The corner protection pattern 80 may be formed of a nitride layer, for example, a silicon nitride layer or a silicon oxynitride layer. The corner protection pattern 80 may be formed by a chemical vapor deposition (CVD) method, for example.

As an example, a conformal nitride layer may be formed on the substrate 51 with gate electrode 77, insulating spacer 63 and source/drain region 75. The nitride layer may be anisotropically etched until a top surface of the source/drain region 75 is exposed, so that the corner protection pattern 80 may be formed. In this case, the corner protection pattern 80 may cover the sidewall of the insulating spacer 63 and the edge of the source/drain region 75 adjacent to the insulating spacer 63.

Referring to FIG. 10, an etch stop layer 81 may be formed on the substrate 51 with corner protection pattern 80. The etch stop layer 81 may conformably cover exposed surfaces of the gate electrode 77, insulating spacer 63, corner protection pattern 80, and source/drain region 75. An ILD 83 may be formed on the substrate 51 with etch stop layer 81. The ILD 83 may be formed of a silicon oxide layer, for example, a high-density plasma (HDP) oxide layer. The etch stop layer 81 may be formed of an insulating layer having an etch selectivity with respect to the ILD 83. For example, when the ILD 83 is a silicon oxide layer, the etch stop layer 81 may be formed of a nitride layer, for example, a silicon nitride layer or a silicon oxynitride layer. The ILD 83 may be planarized to have a flat top surface.

Referring to FIG. 11, the ILD 83 and the etch stop layer 81 may be continuously patterned to form a shared contact hole 85. The process of forming the shared contact hole 85 may include forming a photoresist pattern (not shown) on the ILD 83. The ILD 83 may be anisotropically etched using the photoresist pattern as an etch mask. The anisotropic etching may employ an etching condition having an etch selectivity between the ILD 83 and the etch stop layer 81. The ILD 83 may be partially removed by the anisotropic etching to expose the etch stop layer 81. The exposed etch stop layer 81 may be anistropically or isotropically etched to partially expose the gate electrode 77 and the source/drain region 75.

The insulating spacer 63 and the corner protection pattern 80 may be partially etched while the exposed etch stop layer 81 is being etched, so that the size of the insulating spacer 63 and corner protection pattern 80 may be reduced. However, the sidewall of the insulating spacer 63 is protected by the corner protection pattern 80. Accordingly, the process of etching the exposed etch stop layer 81 may provide a relatively sufficient process margin by the corner protection pattern 80. That is, the corner protection pattern 80 can remain on the edge of the source/drain region 75 adjacent the insulating spacer 63.

Subsequently, a process of cleaning the shared contact hole 85 may be carried out to remove natural oxide layers and particles which might remain on the gate electrode 77 and source/drain region 75. While the cleaning process is carried out, the insulating spacer 63 and corner protection pattern 80 act together as a barrier to prevent the source/drain extension 59 from being exposed.

Referring to FIG. 12, a shared contact plug 89 may be formed to fill the shared contact hole 85. For example, a barrier metal layer 87 and a conductive layer 88 may be sequentially stacked to fill the shared contact hole 85 and cover the ILD 83. The barrier metal layer 87 may be formed of a Ti layer, a TiN layer, a Ta layer, a TaN layer, or a combination layer of several of these components thereof. The conductive layer 88 may be formed of a W layer. The barrier metal layer 87 and conductive layer 88 may be planarized. The process of planarizing the barrier metal layer 87 and the conductive layer 88 may be performed using a chemical mechanical polishing (CMP) process, where the ILD 83 is used as a stop layer. Alternatively, the shared contact plug 89 may be formed only of the conductive layer 88.

The shared contact plug 89 may be thus formed through the ILD 83 and the etch stop layer 81, so as to be in contact with the gate electrode 77 and source/drain region 75. In addition, the shared contact plug 89 may contact the corner protection pattern 80. Accordingly, the shared contact plug 89 is electrically connected to the gate electrode 77 and source/drain region 75. In addition, the shared contact plug 89 is prevented from contacting the source/drain extension 59 due to the corner protection pattern 80 and insulating spacer 63.

Figure 13:
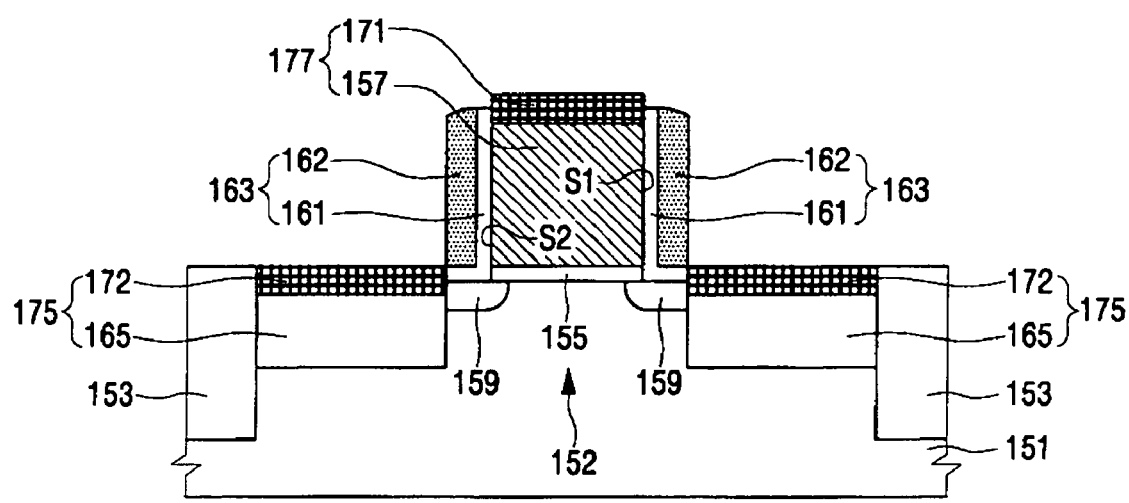
FIGS. 13 to 17 are cross-sectional views illustrating a method of fabricating a shared contact structure in accordance with another example embodiment of the present invention.

FIGS. 13-17 are cross-sectional views illustrating a method of fabricating a semiconductor device according to another example embodiment of the present invention. Referring to FIG. 13, in an example method, of an isolation layer 153 may be formed which defines an active region 152 within a substrate 151. The substrate 151 may be formed of a semiconductor substrate, for example, a silicon wafer or other silicon-based structure. The isolation layer 153 may be formed of an insulating layer, for example, a silicon oxide layer. A gate dielectric 155 may be formed on the active region 152. A gate pattern 157 is formed on the substrate 151 with gate dielectric 155. The gate pattern 157 may be formed of a polysilicon layer, and may cross over the active region 152. In addition, the gate pattern 157 may have first and second sidewalls S1 and S2 facing each other.

Impurity ions may be implanted into the active region 152 using the gate pattern 157 as an ion implantation mask so as to form an LDD region 159. An LDD region 159 may be formed within the active region 152 at each side of the gate pattern 157 as shown in FIG. 13, for example. The LDD region 159 may be formed of an impurity region having either N- or P-type conductivity.

Insulating spacers 163 may be formed on the first and second sidewalls S1 and S2 of the gate pattern 157. The insulating spacer 163 may have an inner spacer 161 covering the first sidewall S1 and an outer spacer 162 covering an outer wall of the inner spacer 161. The inner spacer 161 may be an oxide layer, for example, a silicon oxide layer, and the outer spacer 162 may be formed of a nitride layer, for example, a silicon nitride layer or a silicon oxynitride layer.

Impurity ions may be implanted into the active region 152 using the gate pattern 157 and the insulating spacer 163 as ion implantation masks, so as to form a highly doped drain region 165. The highly doped drain region 165 may be formed by implanting impurity ions having either N- or P-type conductivity. In this case, the highly doped drain region 165 and the LDD region 159 may have the same conductivity type. For example, when the LDD region 159 has a P-type conductivity, the highly doped drain region 165 may also be formed by implanting impurity ions having a P-type conductivity. The LDD region 159 arranged as to be below the insulating spacer 163, as shown in FIG. 13. In addition, the LDD 159 is in contact with the highly doped drain region 165. The highly doped drain region 165 may be formed within the active region 152 at either side of the gate pattern 157. In addition, the highly doped drain region 165 may be formed by processes other than the method described above, for example, by a method of forming a source/drain region which protrudes from a surface of the semiconductor substrate, e.g., a method of forming an elevated source/drain region.

The same method as that described with reference to FIGS. 7 and 8 may be employed to form a gate metal silicide layer 171 on a top surface of the gate pattern 157 and to form source/drain metal silicide layers 172 on top surfaces of the highly doped drain regions 165. The gate metal silicide layer 171 and the source/drain metal silicide layer 172 may be formed of a CoSi layer or a NiSi layer. The sequentially stacked gate pattern 157 and gate metal silicide layer 171, constitute a gate electrode 177. In addition, the sequentially stacked highly doped drain region 165 and source/drain metal silicide layer 172 constitute a source/drain region 175. In this case, a top surface of the source/drain metal silicide layer 172 may be higher than top surfaces of the substrate 151 and LDD region 159. Alternatively, the process of forming the gate metal silicide layer 171 and the source/drain metal silicide layer 172 may be omitted. That is, the gate electrode 177 may be formed of only the gate pattern 157, and the source/drain region 175 may be formed of only the highly doped drain region 165.

Figure 14:
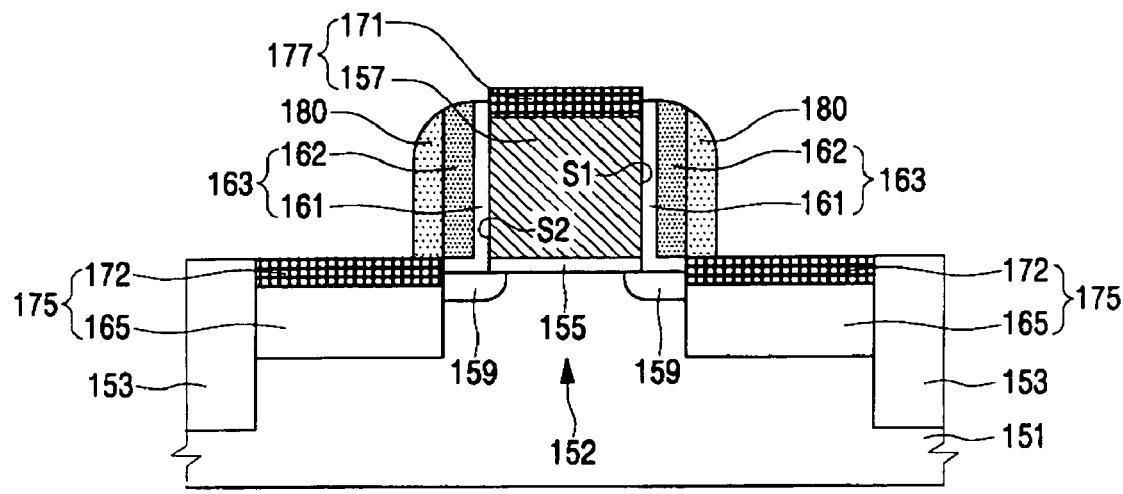

Referring to FIG. 14, a corner protection pattern 180 may be formed on an edge of the source/drain region 175 adjacent to the insulating spacer 163. The corner protection pattern 180 may be formed of a nitride layer, for example, a silicon nitride layer or a silicon oxynitride layer. The corner protection pattern 180 may be formed by the same method as described with reference to FIG. 9. In this case, the corner protection pattern 180 may cover a sidewall of the insulating spacer 163 and the edge of the source/drain region 175 adjacent to the insulating spacer 163. In addition, the corner protection pattern 180 may be formed on each source/drain region 175 at both sides of the gate electrode 177, as shown in FIG. 14.

Figure 15:
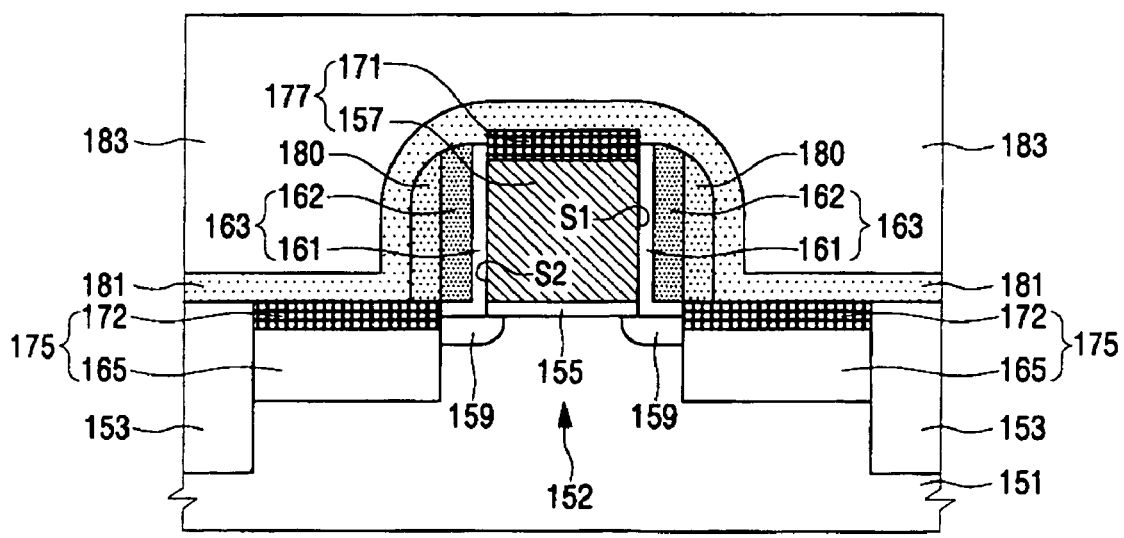

Referring to FIG. 15, an etch stop layer 181 may be formed on the substrate 151 with corner protection pattern 180. An ILD 183 may be formed on the substrate 151 with the etch stop layer 181. The etch stop layer 181 and the ILD 183 may be formed by the same method as that described with reference to FIG. 10.

Figure 16:
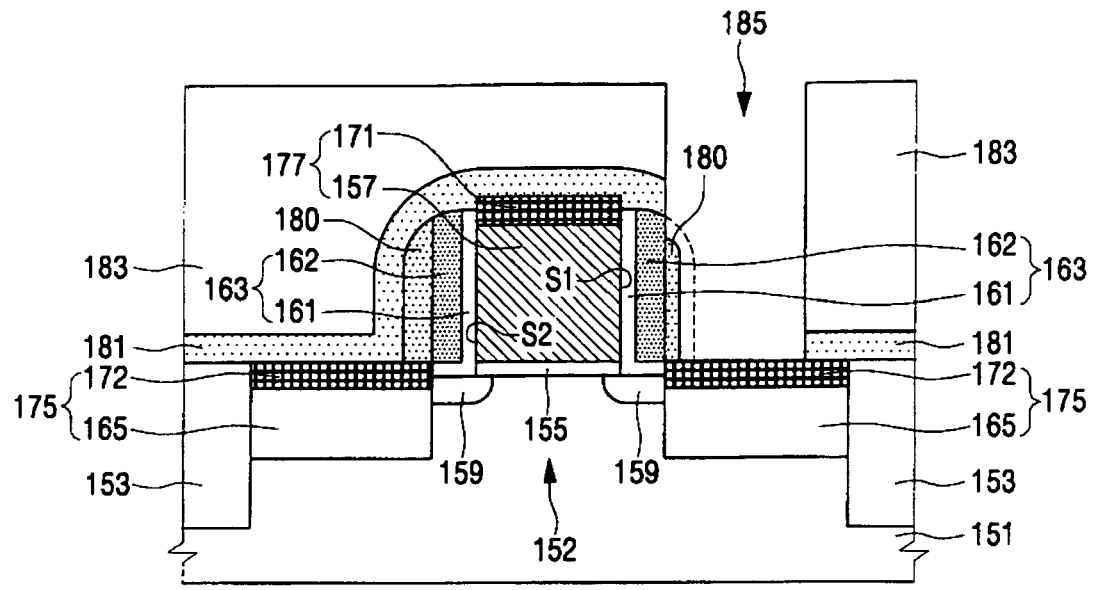

Referring to FIG. 16, the ILD 183 and the etch stop layer 181 may be continuously patterned to form a contact hole 185. The process of forming the contact hole 185 may include forming a photoresist pattern (not shown) on the ILD 183. The ILD 183 may be anisotropically etched using the photoresist pattern as an etch mask. The anisotropic etching process may employ an etching condition having an etch selectivity between the ILD 183 and the etch stop layer 181. That is, the ILD 183 may be partially removed by the anisotropic etching to expose the etch stop layer 181. The exposed etch stop layer 181 may then be anistropically or isotropically etched to expose the source/drain region 175.

The insulating spacer 163 and corner protection pattern 180 may be partially etched while the exposed etch stop layer 181 is being etched, so that the size of the insulating spacer 163 and corner protection pattern 180 may be reduced. However, the sidewall of the insulating spacer 163 is protected by the corner protection pattern 180. Accordingly, the process of etching the exposed etch stop layer 181 may provide a relatively sufficient process margin by the corner protection pattern 180. That is, the corner protection pattern 180 can remain on the edge of the source/drain region 175 adjacent to the insulating spacer 163.

Subsequently, a process of cleaning the contact hole 185 may be carried out to remove natural oxide layers and particles which might remain on the gate electrode 177 and the source/drain region 175. While the cleaning process is carried out, the insulating spacer 163 and corner protection pattern 180 together can act as a barrier to prevent the LDD region 159 from being exposed.

Referring to FIG. 17, a contact plug 189 may be formed to fill the contact hole 185. For example, a barrier metal layer 187 and a conductive layer 188 may be sequentially stacked to fill the contact hole 185 and cover the ILD 183. The barrier metal layer 187 may be formed of a Ti layer, a TiN layer, a Ta layer, a TaN layer, or a combination layer at several of these components. The conductive layer 188 may be formed of a W layer. The barrier metal layer 187 and the conductive layer 188 are planarized. The process of planarizing the barrier metal layer 187 and conductive layer 188 may be performed using a CMP process with the ILD 183 being used as a stop layer. Alternatively, the contact plug 189 may be formed of only the conductive layer 188.

The contact plug 189 may thus be formed through the ILD 183 and the etch stop layer 181 to contact the source/drain region 175. In addition, the contact plug 189 may be in contact with the corner protection pattern 180. Accordingly, the contact plug 189 is electrically connected to the source/drain region 175, and may be prevented from contacting the LDD region 159 by the corner protection pattern 180 and insulating spacer 163.

According to the present invention as described in the above example embodiments, a corner protection pattern may be formed on an edge of a source/drain region adjacent to an insulating spacer. A source/drain extension is formed in an active region below the insulating spacer. In addition, a shared contact plug is disposed through an ILD to contact a gate electrode, the corner protection pattern, and the source/drain region. Accordingly, any contact between the shared contact plug and the source/drain extension may be prevented due to the corner protection pattern and the insulating spacer. Thus, any path of leakage current between the shared contact plug and source/drain extension may be prevented.

Example embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of example embodiments of the present invention as set forth in the following claims.

What is claimed is:

1. A method of fabricating a semiconductor device, comprising:

forming a gate pattern having first and second sidewalls on either side of the gate pattern facing each other on a substrate;

forming a lightly doped drain region adjacent the first sidewall and disposed on an opposite side of the second sidewall within the substrate;

forming an insulating spacer covering the first sidewall;

forming a highly doped drain region adjacent to the first sidewall and disposed on an opposite side of the second sidewall within the substrate;

forming a corner protection pattern adjacent the highly doped drain region and the insulating spacer and contacting a sidewall of the insulating spacer;

forming a gate metal silicide layer on a top surface of the gate pattern;

forming a source/drain metal silicide layer on a top surface of the highly doped drain region, where the gate metal silicide layer and source/drain metal silicide layer are formed prior to forming the corner protection pattern;

after forming the highly doped drain region, forming an etch stop layer to cover the gate pattern, the insulating spacer, the corner protection pattern, and the highly doped drain region;

forming an inter-layer dielectric on the substrate; and forming a contact hole penetrating the inter-layer dielectric, wherein forming the contact hole includes, anisotropically etching the inter-layer dielectric to expose the etch stop layer; and etching the etch stop layer to expose the corner protection pattern and the source/drain metal silicide layer, wherein the etch stop layer remains except on a portion of the formed contact hole, and wherein the highly doped drain region is self-aligned outside of the insulating spacer.

2. The method according to claim 1, further comprising:

forming an isolation layer defining an active region within the substrate prior to forming the gate pattern.

3. The method according to claim 1, wherein the corner protection pattern is formed of a nitride layer.

4. The method according to claim 1, further comprising:

forming a contact plug filled in the contact hole, wherein the interlayer dielectric and contact plug are formed after the corner protection pattern.

5. The method according to claim 1, wherein forming the corner protection pattern comprises:

forming a nitride layer on the substrate having the insulating spacer and the source/drain metal silicide layer; and anisotropically etching the nitride layer until the source/drain metal silicide layer is exposed.

6. The method according to claim 1, wherein the contact plug is in contact with the corner protection pattern and the source/drain metal silicide layer.

7. The method according to claim 1, wherein the contact plug is in contact with the gate metal silicide layer, corner protection pattern and source/drain metal silicide layer.

8. The method according to claim 1, wherein the corner protection pattern contacts with a top surface of the source/drain metal silicide layer, and wherein the corner protection pattern remains except on a sidewall of the source/drain metal silicide layer.

* * * * *